United States Patent [19]

Joho

[11] Patent Number: 5,408,634
[45] Date of Patent: Apr. 18, 1995

[54] DUAL DISK SYSTEM FOR CAUSING OPTIMAL DISK UNITS TO EXECUTE I/O REQUEST CHANNEL PROGRAMS

[75] Inventor: Teruaki Joho, Tokyo, Japan

[73] Assignee: Kabushiki Kaisha Toshiba, Kawasaki, Japan

[21] Appl. No.: 225,472

[22] Filed: Mar. 23, 1994

Related U.S. Application Data

[63] Continuation of Ser. No. 575,428, Aug. 30, 1990, abandoned.

[30] Foreign Application Priority Data

Aug. 31, 1989 [JP] Japan .................................. 1-225404

[51] Int. Cl.⁶ ............................................. G06F 12/00
[52] U.S. Cl. ................................... 395/425; 395/575; 395/650; 364/DIG. 2; 364/943.9; 364/944.2; 364/959.1; 364/959.2; 364/964; 364/954.7; 364/966; 364/966.1; 364/966.5
[58] Field of Search .............. 395/275, 375, 425, 575, 395/600, 650; 369/84

[56] References Cited

U.S. PATENT DOCUMENTS

| | | | |
|---|---|---|---|
| 3,702,006 | 10/1972 | Page ................................ | 395/275 X |
| 4,415,970 | 11/1983 | Swenson et al. ................. | 395/425 |
| 4,425,615 | 1/1984 | Swenson et al. ................. | 395/425 |
| 4,633,387 | 12/1986 | Hartung et al. .................. | 395/650 |
| 5,088,058 | 2/1992 | Salsburg .......................... | 364/500 |

OTHER PUBLICATIONS

"Enhanced Disk Task Sequencing," IBM Technical Disclosure Bulletin, vol. 29 No. 5, Oct., 1986, pp. 1946-1948.

"Dynamically Maintained Command Chains," vol. 24 No. 12, May 1982, IBM Technical Disclosure Bulletin, pp. 6605-6606.

Iwanami, Operating System of Software Science 56, pp. 343-348 (Published Sep. 6, 1988).

*Primary Examiner*—Paul V. Kulik
*Attorney, Agent, or Firm*—Finnegan, Henderson Farabow, Garrett & Dunner

[57] ABSTRACT

In a dual disk system constituted by two disk units which have the identical data and are of the same type, the seek time required for each channel program queued in a corresponding I/O queue is calculated, and the total seek time obtained by adding each seek time and a predictive head position assumed when a finally queued channel program are stored in a memory. When a new I/O request channel program is generated, the seek time required for the new channel program is added to each total seek time. The seek time required for the new channel program is added to the total seek time of one of the disk units which has a lesser total seek time. In addition, the head position is updated to the predictive head position assumed when the new channel program is executed. The new channel program is queued in the I/O queue corresponding to the disk unit having the lesser total seek time.

10 Claims, 5 Drawing Sheets

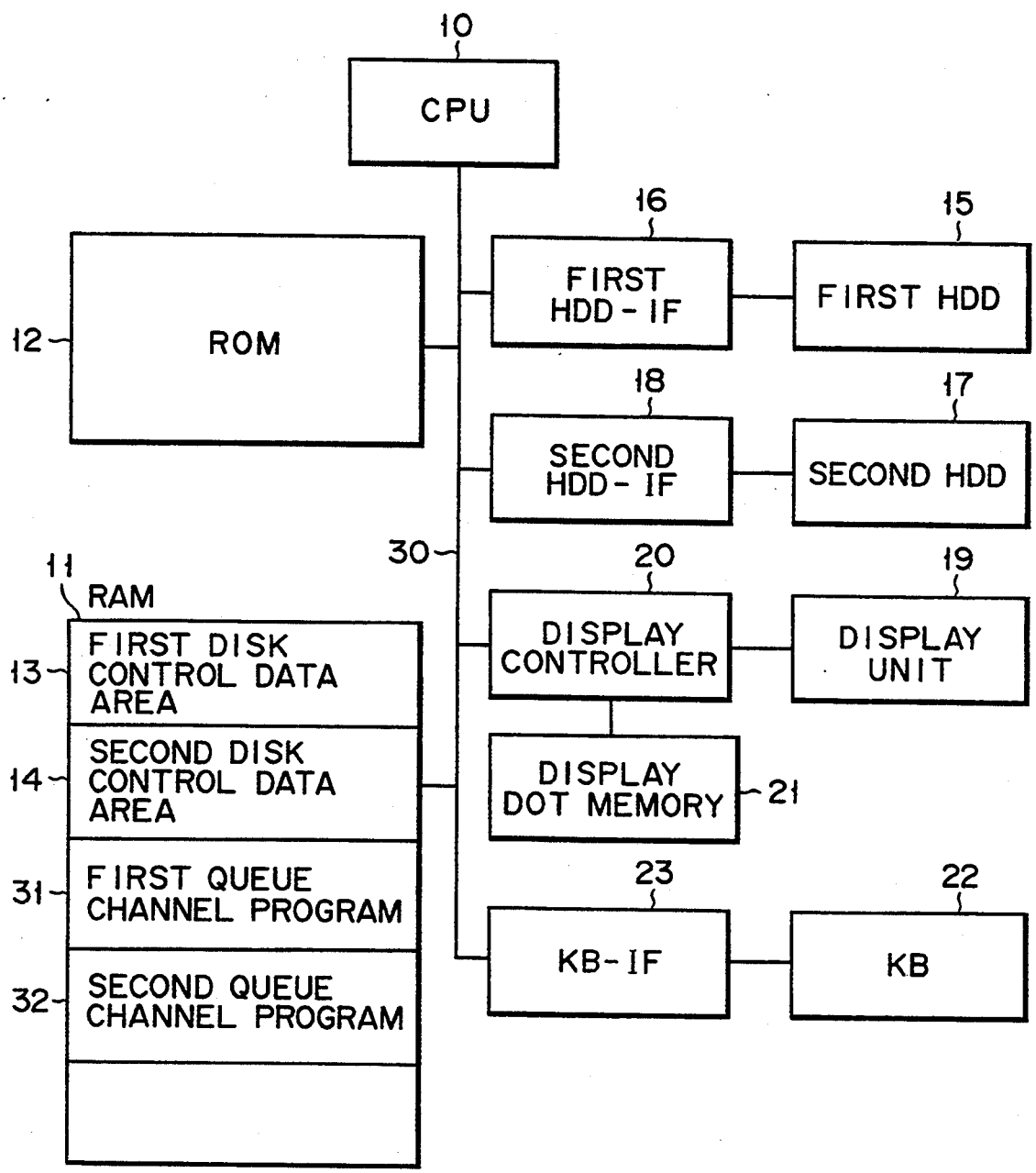
F I G. 1

DUAL DISK SYSTEM FOR CAUSING OPTIMAL DISK UNITS TO EXECUTE I/O REQUEST CHANNEL PROGRAMS

This application is continuation of application Ser. No. 07/575,428, filed Aug. 30, 1990, now abandoned.

BACKGROUND OF THE INVENTION

1. Field of the Invention

The present invention relates to a data processing apparatus comprising two magnetic disk units of the same type which store identical data and serve as backup disk units.

2. Description of the Related Art

A data processing apparatus of a dual disk computer system is known. This apparatus uses two magnetic disk units of the same type as backup means and causes them to store identical data. In such a conventional apparatus, input/output (I/O) control of these two magnetic disks are performed by the following two methods. According to the first method, one magnetic disk unit is used exclusively as a backup unit while read request channel programs are permanently chained in the I/O queue of the other magnetic disk unit. According to the second embodiment, each read request channel program is chained in the I/O queue of one of the first and second magnetic disk units which has a smaller I/O queuing count.

The I/O execution time of a magnetic disk unit greatly depends on a seek width on the magnetic disk. More specifically, the I/O time of a disk is given by:

$$D = S + R + T$$

where S is the seek time, R is the rotational wait time, and T is the transfer time. Of these times, the seek time is the longest. It is most important to minimize the seek time.

In both the first and second methods, however, no consideration is given to the seek width. Therefore, I/O processing cannot be performed at high speed.

SUMMARY OF THE INVENTION

It is the object of the present invention to provide a dual disk system in which I/O request channel programs are executed by optimal disks.

According to the first aspect of the present invention, there is provided a method of causing optimal disk units to execute I/O request channel programs in a data processing system including a plurality of disk units, comprising the steps of: a) calculating seek times required for the I/O request channel programs queued in I/O queues in respective disk units, and adding the seek times of the I/O request channel programs queued in the respective I/O queues to calculate a total seek time of each I/O queue; b) storing head position data on each of the disk units which is designated by an I/O request channel program finally queued in each of the I/O queues, and the total seek time of each of the disk units; c) calculating a seek time required for a new I/O request channel program upon generation thereof, adding the seek time to the total seek time of each of the disk units to select a minimum total seek time; d) updating the head position data of the disk unit having the minimum total seek time to the head position designated by the new I/O request program, and adding the seek time required for the new I/O request channel program to the total seek time; and e) queuing the new I/O request channel program in the I/O queue of the disk unit having the minimum total seek time.

According to the second aspect of the present invention, there is provided a data processing system comprising: a plurality of disk units; memory means for storing I/O queues in which I/O request channel programs for controlling the respective disk units are queued; means for calculating seek times required for the I/O request channel programs queued in I/O queues in the respective disk units, and adding the seek times of the I/O request channel programs queued in the respective I/O queues to calculate a total seek time of each I/O queue; means for storing head position data on each of the disk units which is designated by an I/O request channel program finally queued in each of the I/O queues, and the total seek time of each of the disk units; means for calculating a seek time required for a new I/O request channel program upon generation thereof, adding the seek time to the total seek time of each of the disk units to select a minimum total seek time; means for updating the head position data of the disk unit having the minimum total seek time to the head position designated by the new I/O request program, and adding the seek time required for the new I/O request channel program to the total seek time; and means for queuing the new I/O request channel program in the I/O queue of the disk unit having the minimum total seek time.

According to the present invention, in the dual magnetic disk type computer system, the position of a magnetic head assumed when a finally queued channel program of a plurality of channel programs queued in the I/O queue of each disk unit is executed, and the seek time required for each currently queued channel program are calculated in advance, and the sum of the seek times, e.g., the total seek time is stored in the memory. When a new read I/O request channel program is issued from the CPU, the seek time of each disk unit is calculated in the following manner. A seek width is obtained first by calculating the absolute value of the difference between a final head position of the first disk unit and a seek address (position) designated by the new I/O request channel program. A seek time is obtained from this seek width and is added to the total seek time of the first magnetic disk unit which is stored in the memory. Similarly, a seek width is obtained on the basis of the final head position of the second magnetic disk unit and the new I/O request channel program. A seek time is calculated on the basis of this seek width and is added to the total seek time of the second magnetic disk unit which is stored in the memory. The first and second total seek times are compared with each other, and the new I/O request channel program is queued in the I/O queue of the disk unit having a lesser total seek time value. As a result, the I/O processing with respect to the magnetic disk units can be performed at high speed.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a block diagram showing a dual disk system according to an embodiment of the present invention;

DETAILED DESCRIPTION OF THE PREFERRED EMBODIMENTS

Figure 3:
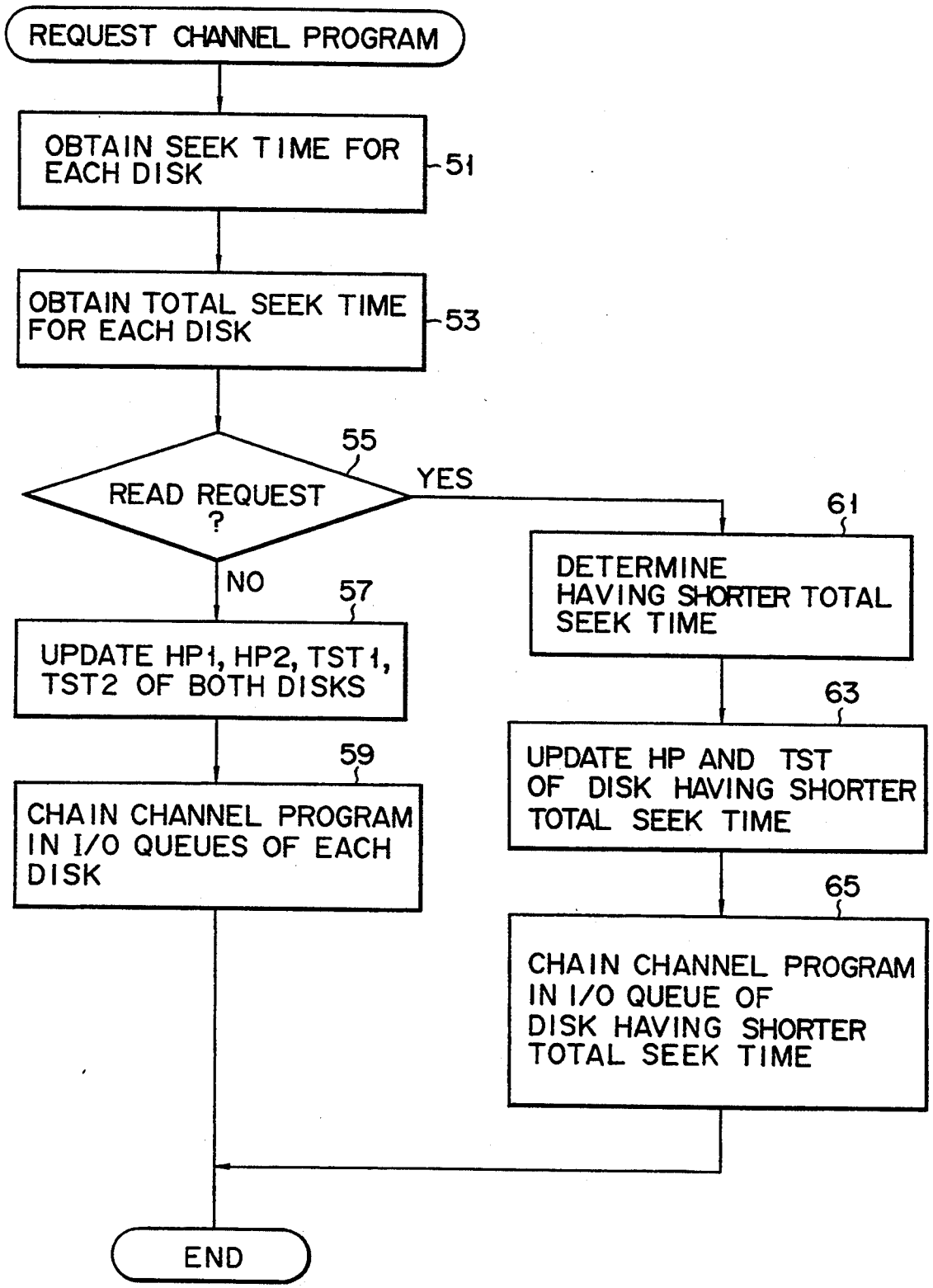
FIG. 3 is a flow chart showing the contents of I/O control processing to be performed when an I/O request channel program is issued from a CPU.
Figure 4:
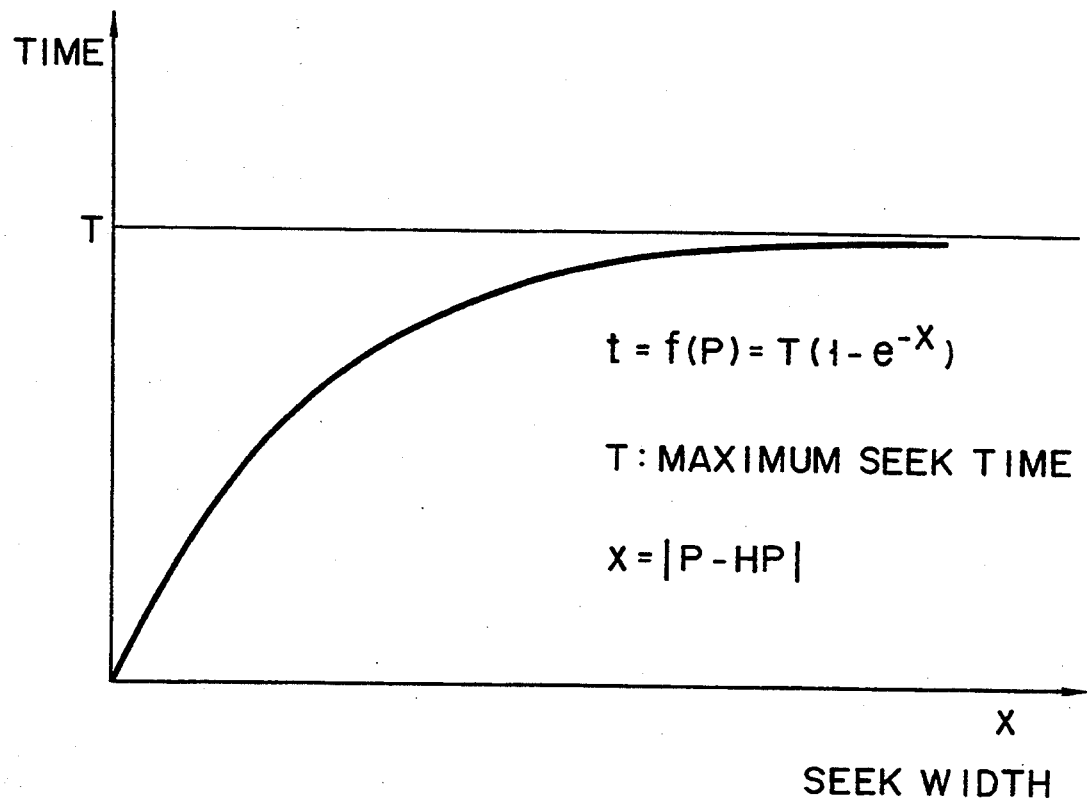
FIG. 4 is a graph showing general seek width/seek time characteristics of a disk unit and a conversion equation for obtaining a seek time from a seek width.

A central processing unit (CPU) 10 is connected to first and second hard disk drives 15 and 17 through a system bus 30 and first and second hard disk interfaces 16 and 18 serving as input/output (I/O) channels, respectively. A read-only memory (ROM) 12 stores programs shown by flow charts in FIGS. 3 and 5. A random access memory (RAM) 11 has first and second control data areas. The first control data area is used to store the position of a magnetic head assumed when an I/O request channel program finally queued in a first I/O queue 31 (formed in the RAM 11) for the first disk drive is executed, and the total value of seek times required for the respective I/O request programs queued in the first I/O output queue 31. Similarly, the second control data area is used to store the position of a magnetic head assumed when an I/O request channel program finally queued in a second I/O queue 32 (formed in the RAM 11, similar to the first I/O queue) for the second hard disk drive is executed, and the total value of seek times required for the respective I/O request channel programs queued in the second I/O queue 32.

I/O request channel programs are queued in the first and second I/O queues 31 and 32, respectively. The I/O request channel programs are programs for defining the first and second hard disk interfaces 16 and 18 and the first and second hard disk drives 15 and 17. Each channel program is constituted by one or a plurality of channel commands. One channel command defines one I/O operation. A channel command is constituted by, e.g., a command code such as seek, search, read, or read command code, and a disk address. The first hard disk interface 16 sequentially executes I/O request channel programs queued in the first queue together with the first hard disk drive 15. Similarly, the second hard disk interface 18 sequentially executes I/O request channel programs queued in the second queue together with the second hard disk drive 17. When the I/O request channel programs are completed, the first and second hard disk interfaces 16 and 18 cause interruption in the CPU 10 so as to acknowledge the completion of the programs.

A display unit 19 as an output unit is connected to the system bus 30 through a display controller 20. A display dot memory 21 for storing data to be displayed on the display unit 20 is connected to the display controller 20. In addition, a keyboard 22 as an input unit is connected to the system bus 30 through a keyboard interface 23.

Figure 2A:
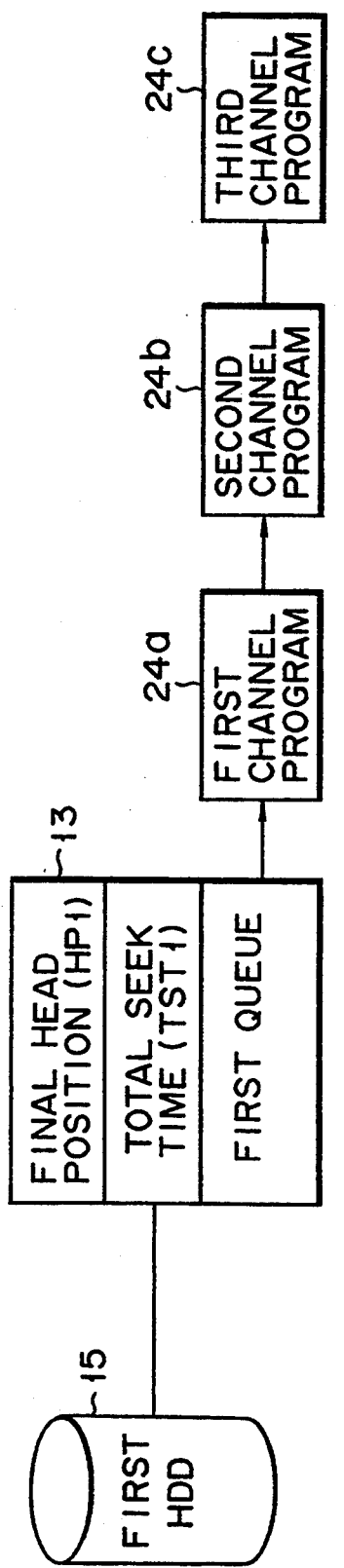
FIGS. 2A and 2B are views respectively showing schematic arrangements of first and second disk units, first and second control data areas in which control data for the first and second disk units are stored, and first and second I/O queues.
Figure 2B:
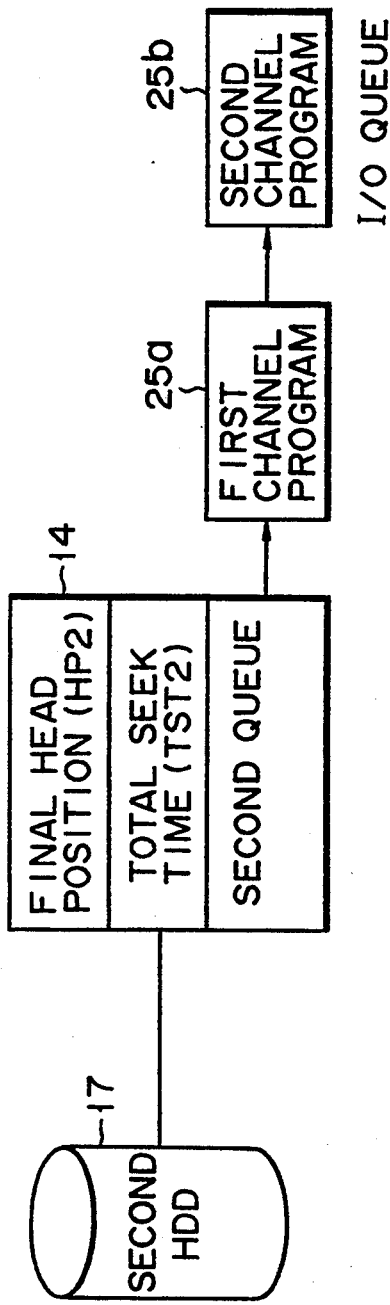

FIGS. 2A and 2B respectively show schematic arrangements of the first and second hard disk drives, the first and second disk data areas used to store data for controlling these hard disk drives, and the first and second control data areas 13 and 14 used to store first and second queues in which I/O request channel programs are queued. The first control area 13 serves to store final head position data HP1 representing the position of the magnetic head assumed when an I/O request channel program finally queued in the first queue is executed, and a total seek time TST1 required for the respective channel programs queued in the first queue. In addition, first and third channel programs 24a through 24c are queued in the first queue.

The second disk control data area 14 serves to store final head position data HP2 representing the position of the magnetic head assumed when an I/O request channel program finally queued in the second queue is executed, and a total seek time TST2 required for the respective channel programs queued in the second queue. In addition, first and second channel programs 25a and 25b are queued in the second queue.

An embodiment of the present invention will be described below with reference to FIGS. 3 through 6.

In step 51, the CPU 10 reads out the final head positions HP1 and HP2 and the total seek times TST1 and TST2 from the first and second disk control data areas 13 and 14 in the RAM 11, respectively. In addition, the CPU 10 obtains a new position of the magnetic head from a seek address designated by a new I/O request channel program to be executed next. The CPU 10 then obtains a first seek width by subtracting the final head position HP1 from a new head position P. A first seek time is calculated from this seek width by using a seek time conversion function shown in FIG. 4 as follows:

$$t = f(p) = T(1 - e^{-x})$$

$$x = |p - HP1|$$

where x is the seek width, t is the seek time, and T is the maximum seek time.

Similarly, the CPU 10 obtains a second seek width by subtracting the final head position HP2 from the new head position P. A second seek time is calculated from this second seek width by using the seek time conversion function.

In step 53, the CPU 10 adds the first seek time calculated in step 51 to the first total seek time TST1, and also adds the calculated second seek time to the second total seek time. As a result, the CPU 10 obtains a predictive total seek time required when the new I/O request channel program is queued in the first queue and a predictive total seek time required when it is queued in the second queue.

In step 55, the CPU 10 checks whether the new I/O request channel program is a read request. If YES in step 55, the CPU 10 determines, in step 61, a lesser total seek time of the total seek times of the first and second disk drives which are obtained in step 53. In step 63, the CPU 10 updates the final head position HP1 (or HP2) in the disk control data area corresponding to the disk drive having the lesser total seek time to the new head position assumed when the new I/O request channel program is executed. At the same time, the CPU 10 updates the total seek time TST1 (or TST2) to the corresponding total seek time of the total seek times calculated in step 53. In step 65, the CPU 10 chains the new channel program in the I/O queue of the disk drive having the lesser total seek time.

If NO in step 55, the CPU 10 updates, in step 57, the final head positions HP1 and HP2 and the total seek times TST1 and TST2 in the first and second control data areas 13 and 14 of the respective disk drives to the new head positions assumed on the first and second disk drives when the new I/O request channel program is executed, and the first and second total seek times calculated in step 53, respectively. In step 59, the CPU 10 chains the new I/O request channel program in the first and second I/O queues.

Figure 5:
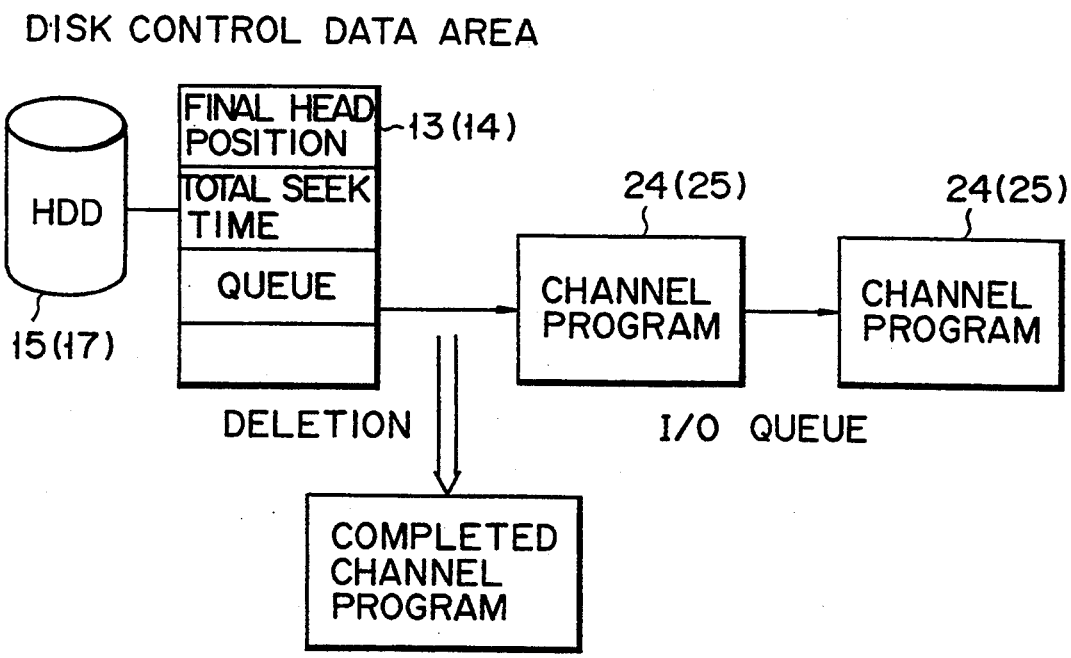
FIG. 5 is a schematic view showing termination processing performed in the arrangements in FIGS. 2A and 2B.
Figure 6:
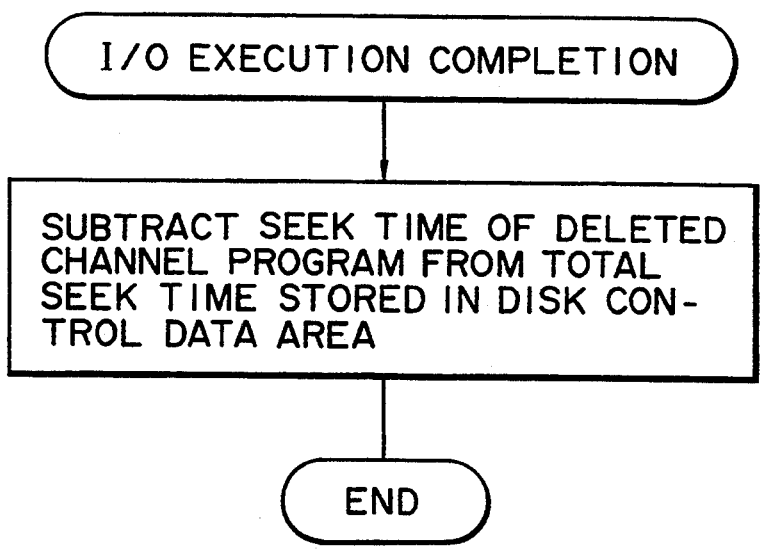
FIG. 6 is a flow chart showing the contents of the termination processing in FIG. 5.

Subsequently, when the start channel programs respectively chained in the I/O queues of the first and second hard disk drives 15 and 17 are executed and completed as shown in FIG. 5, termination processing shown in FIG. 6 is performed. More specifically, the seek time of the deleted channel program is subtracted from the total seek time TST1 (TST2) in the disk control data area 13 (14), and the subtraction result is stored as a new total seek time TST1 (TST2) in the disk control data area 13 (14).

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of causing disk units to optimally execute I/O request channel programs in a dual disk system including two disk units each having identical data and an associated I/O queue for queuing the I/O request channel programs and being of a same type, comprising the steps of:
    a) storing head position data representative of a position in which a head of each of said disk units will be located after the I/O request channel programs queued latest in each of the I/O queues have been executed, and a corresponding total seek time of each of said disk units which is calculated by adding the seek times of the I/O request channel programs queued in the respective I/O queues;
    b) calculating a seek time required for a new I/O request channel program upon generation thereof from the head position data after the latest queued I/O request channel programs have been executed and a seek address designated by the new I/O request channel program, and adding the calculated seek time to the total seek time of each of said disk units to determine a projected total seek time for each of said disk units;
    c) updating the head position data of one of said disk units having the minimum projected total seek time to the position which the head of said one disk unit will be in after the new I/O request program has been executed, and for adding the seek time required for the new I/O request channel program to the total seek time of said one disk unit having the minimum projected total seek time;
    d) queuing the new I/O request channel program in the I/O queue of said one disk unit having the minimum projected total seek time; and
    e) sequentially executing the I/O request channel programs queued in the I/O queues of said disk units.

2. A method according to claim 1, further comprising:
    f) subtracting the seek time required for an I/O request channel program queued in the I/O queue from the total seek time upon execution of the I/O request channel program queued in the I/O queue, and storing the subtraction result as a new total seek time.

3. A method according to claim 1, wherein at least one of the I/O request channel programs queued in the I/O queues is a request to read information from said disk units.

4. A method according to claim 1, wherein the step b) includes calculating a seek width on the basis of a position in which a head of a disk unit will be located after the I/O request channel program queued latest has been executed and a position in which a head of said disk unit will be located after the new I/O request channel program has been executed, and calculating the seek time required for the new I/O request channel program from the seek width by using a predetermined conversion function.

5. A method according to claim 1, further comprising:
    updating the stored head position data of each of said disk units to a position in which the head of each of said disk units will be located after the new I/O request channel program has been executed, and adding the seek time required for the new I/O request channel program to the total seek time of each of said disk units so as to calculate a total seek time of each of said disk units in step a) when the new I/O request channel program is a write request.

6. A data processing system comprising:
    dual disk units each having identical data and being of a same type;
    memory means for storing I/O queues in which I/O request channel programs for controlling said dual disk units are queued, each I/O queue being associated with one of said disk units;
    means for storing total seek times of each of said disk units required for the I/O request channel programs queued in I/O queues for each of said disk units and head position data representative of a position in which a head of each of said disk units will be located after an I/O request channel program queued latest in each of the I/O queues has been executed;
    means for calculating a seek time required for a new I/O request channel program upon generation thereof, from the head position data after the latest queued I/O request channel programs have been executed and a seek address designated by the new I/O request channel program, and for adding the seek time to the total seek time of each of said disk units to determine a projected total seek time for each of said disk units;
    means for updating the head position data of one of said disk units having the minimum projected total seek time to the position in which the head of said one disk unit will be located after the new I/O request channel program has been executed, and for adding the seek time required for the new I/O request channel program to the total seek time of said one disk unit having the minimum projected total seek time;
    means for queuing the new I/O request channel program in the I/O queue of said one disk unit having the minimum projected total seek time; and means for sequentially executing the I/O request channel programs queued in the I/O queues of said disk units.

7. A system according to claim 6, further comprising:

means for subtracting the seek time required for an I/O request channel program queued in the I/O queue from the total seek time upon execution of the I/O request channel program queued in the I/O queue, and for storing the subtraction result as a new total seek time.

8. A system according to claim 6, wherein at least one of the I/O request channel programs queued in the I/O queues is a request to read information from said disk units.

9. A system according to claim 6, wherein said means for calculating the total seek times includes means for calculating a seek width on the basis of a position in which the head of a disk unit will be located after the I/O request channel program queued latest has been executed and a position in which the head of said disk unit will be located after the new I/O request channel program has been executed and for calculating the seek time required for the new I/O request channel program from the seek width by using a predetermined conversion function.

10. A system according to claim 6, further comprising:

means for updating the stored head position data of each of said disk units to a position in which the head of each of said disk units will be located after the new I/O request channel program has been executed, and for adding the seek time required for the new I/O request channel program to the total seek time of each of said disk units to calculate a total seek time of each of said disk units to be stored in said memory means when the new I/O request channel program is a write request.

* * * * *